United States Patent [19]

Yamagishi

[11] 4,118,992

[45] Oct. 10, 1978

[54] CLUTCH MECHANISM FOR PUSH-BUTTON TUNER

[75] Inventor: Hiroaki Yamagishi, Ueda, Japan

[73] Assignee: Ono Seiko Co., Ltd., Tokyo, Japan

[21] Appl. No.: 786,943

[22] Filed: Apr. 12, 1977

[30] Foreign Application Priority Data

Apr. 17, 1977 [JP] Japan ................................. 51-43978

[51] Int. Cl.² .................. F16H 35/18; F16D 13/50
[52] U.S. Cl. .................................. 74/10.33; 74/10.85;
192/89 B
[58] Field of Search ................ 74/10.27, 10.33, 10.85;
334/7; 192/89 B

[56] References Cited

U.S. PATENT DOCUMENTS

| 2,367,860 | 1/1945 | Gersch | 74/10.33 X |
| 2,811,045 | 10/1957 | Thompson | 74/10.33 |
| 3,657,932 | 4/1972 | Walsh | 74/10.33 |
| 3,906,806 | 9/1975 | Harlan | 74/10.33 |

*Primary Examiner*—Allan D. Herrmann
*Attorney, Agent, or Firm*—Wenderoth, Lind & Ponack

[57] ABSTRACT

A clutch mechanism for a push-button type tuner is adapted for use in a tuner having cores shiftable with respect to coil bodies, the tuner being devised to maintain the varied position of the core. The mechanism includes a disc unitarily connected to a rotatable shaft, the disc being sandwiched between a lever support and plural levers which function to bring the lever support into engagement or disengagement with the disc upon the depression or release of one of the push-buttons, whereby smooth clutching or declutching operation is obtained.

6 Claims, 5 Drawing Figures

CLUTCH MECHANISM FOR PUSH-BUTTON TUNER

BACKGROUND AND BRIEF SUMMARY OF THE INVENTION

The present invention relates to a clutch mechanism for a push-button type tuner and, more particularly, to a clutch mechanism for a tuner of the push-button type capable of correctly maintaining the position of a tuning core which is variable with respect to a coil body.

Such a tuner has been well known as having both a push-button type tuning mechanism adapted to cause a change in inductance by a selective depression of push-buttons and an additional manual tuning mechanism having a manually operative tuning shaft adapted to be rotated to change the inductance.

In such a tuner, the change in the inductance is effected by changing the position of a tuning core with respect to the coil body of the tuner either by depressing push-buttons or by rotating the manual tuning shaft. In order to correctly maintain the core at the selected position, after the position of the core is selected, a clutch mechanism is incorporated in such a tuner.

In those tuners which must be constructed to be compact and small, as is the case of push-button type tuners, the stroke of the tuning core for a given frequency range becomes inevitably small so that the allowable range of deviation of the core is made correspondingly small. Thus, the core is apt to get out of the allowable range due to an application of external forces, e.g. vibration or the like.

In order to avoid this, it is strictly required to insure the maintainance of a correct position of the core. Consequently, in substantially the above described type of tuner, a declutch arrangement has been provided which decouples the manual tuning shaft when a push-button is depressed. The arrangement usually includes a crown gear mounted on one end and a disc having a friction ring bonded thereto on the other end of a sleeve received on a drive shaft coupled to a treadle bar through intermeshing gear members, and another disc contacting the first disc by means of the friction ring is mounted on the other edge of the drive shaft. A finger like end of a declutch bar is received in the circumferential recess of the sleeve. A coil spring received on the drive shaft sandwiched between the sleeve and a side plate of a tuner frame through which the drive shaft extends and is journaled thereon, provides the proper force against the sleeve to cause the two discs to make firm engagement with the friction ring therebetween. The manual tuning shaft is coupled to the crown gear through a pinion connected to the former. Rotation of manual tuning shaft imparts rotation to the crown gear to in turn rotate the drive shaft. The declutch bar moves the sleeve toward the frame against the biasing force of the coil spring upon the depression of the push-button, whereby the two discs are disengaged with the resultant decoupling of the manual tuning shaft from the rotatable drive shaft.

As has been described, in a push-button type tuner incorporating both of the push-button and manual tuning mechanisms, the push-button type tuning mechanism must be provided with a clutch mechanism, i.e. means for disengaging the two discs from each other. In Addition, means are necessary for holding the core at the right position, after it has been moved to the position for varying the inductance.

Thus, the two discs have a substantial significance in maintaining a correct position of the core. This is especially true in the case of a radio for an automobile, in which a push-button type tuner is used under a severe condition, which necessitates the use of relatively large discs, as well as a friction ring, so as to avoid slippage between the two discs. The large sizes of the discs are unacceptable from the view point of current commercial demand which requires small size and light weight for the radio receivers.

Another solution previously proposed is to use a stronger compression coil spring to increase the force with which the two discs are pressed each other. However, such a spring inconveniently requires a stronger force to be applied for depressing the buttons during the operation for changing the inductance.

This invention is devised to provide a solution to those problems, and is based on the results of a series of studies for solving these problems. It is an object of the invention to provide an improved declutching arrangement for a push-button type tuner which makes it possible to decouple the manual tuning shaft upon depression of one of the push-buttons provided therein, wherein the correct maintenance of the core position is ensured.

It is another object of this invention to provide a simple declutch mechanism equiped with lever means which performs a smooth and accurate declutching operation of a push-button type tuner.

It is still another object of the invention to provide a declutch mechanism which is relatively small in size and which is less expensive and contributes to a reduction of the production cost of the tuner.

Other and further objects, features and advantages of the invention will appear more fully from the following description.

DETAILED DESCRIPTION

The clutch mechanism of the invention will be described hereinafter, with specific reference to the drawings.

Figure 1:
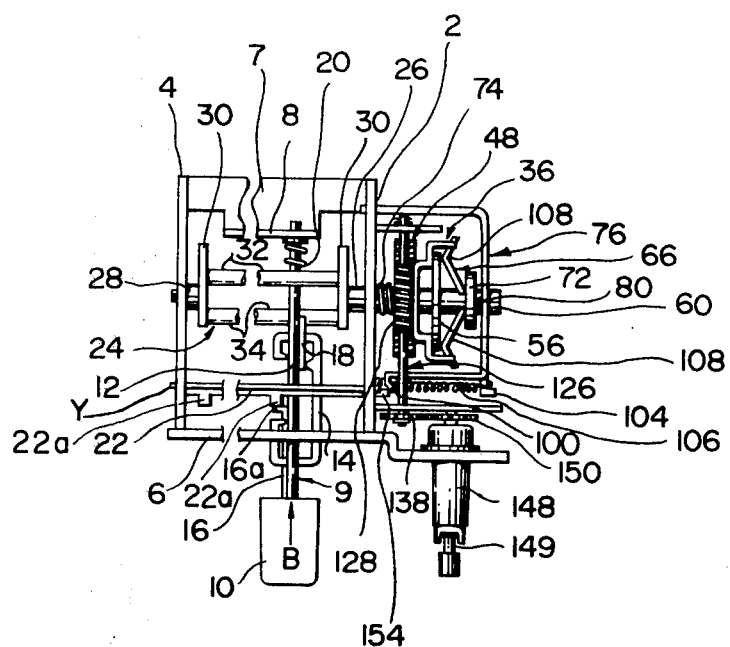
FIG. 1 is a plan view of the tuner illustrating in detail an improved declutch assembly with the case thereof removed.
Figure 2:
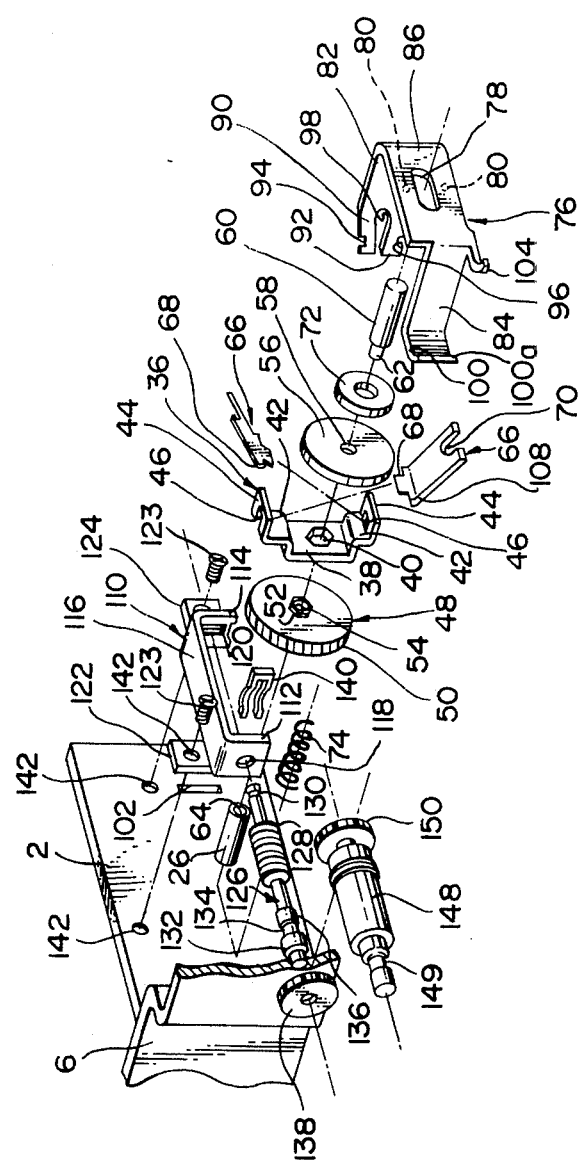
FIG. 2 is an exploded, perspective view of the declutch assembly according to this invention.

Referring to FIGS. 1 and 2, there are shown side plates 2 and 4 of a frame, a front plate 6, a bottom plate 7, and a rear plate 8. A push-button mechanism is constituted by a push-button 10, a push-button rod 12, a retaining spring plate 14, a push bar 16 having an L-shaped edge 16a, and a channeling plate 18. A coil spring 20 and a comb-shaped rotary member 22 including a shaft 152 having teeth 22a depending therefrom, are provided in a similar manner as in a prior art. The rotary member 22 is rotatably supported on side plates 2 and 4 by means of edges Y of the horizontally extending shaft 152, and usually the teeth 22a of the rotary member are located in a slightly frontwardly tilted position ready to touch the L-shaped edge 16a of the push bar 16.

An L-shaped projection 154 of the rotary member 22 integrally formed at one end of the shaft 152 is positioned almost in touching contact with an outside edge 100a of a cam 100 of a lever plate 76 which will be described hereinafter.

A treadle bar assembly 24 is rotatably supported on the pair of side plates 2 and 4, by means of shafts 26, 28 fixed to and extending from a pair of support members 30, to the inside of which are fixed a pair of parallel rods 34.

The preservation or maintenance of the core at correct positions, upon which the present invention is focussed, can be performed by maintaining the correct angular position of the treadle bar assembly 24. The slide bar on which the core is mounted and other associated members are of same construction as conventional arrangements. Therefore, the structures are not detailed here.

As will be seen most clearly from FIG. 2, a clutch lever support 36 consists of a plate which is bent to form symmetrically stepped portions. More specifically, the clutch lever support has a first flat portion 38 having therethrough a polygonal hole 40, second flat portions 42 and vertical portions 44 bent perpendicularly to the flat portions.

The vertical portions 44 each have a square hole 46. A gear wheel 48 has a peripheral gear 50, and is provided with polygonally shaped bearing 52 concentric and unitary therewith and projecting laterally therefrom. A round hole 54 is formed extending through the bearing 52. The bearing 52 of the gear wheel 48 is press-fitted into the hole 40 of the clutch lever support 36, whereby the clutch lever support 36 and the gear wheel 48 are connected to each other.

One end of the shaft 26 of the treadle bar assembly 24 passes through side plate 2 and extends to be received by the round hole 54 of the bearing 52. Thus, the members 48 and 36 are assembled to be rotatable on and slidable along the shaft 26. A disc 56 has a central hole 58 of a diameter smaller than the outer diameter of the shaft 26. A shaft 60 of the same diameter as the shaft 26 has at one end thereof a male screw 62 of a smaller diameter adapted to be received by the hole 58 and then to be engaged by a female threaded bore 64 formed in one end of the shaft 26 concentrically therewith, whereby the disc 56 is fixed between the pair of shafts 26, 60. A pair of clutch levers 66 are formed by bending respective flat plates into an L-shape having an apex portion 108. Each clutch lever is provided with a projection 68 at its one end, and a U-shaped groove 70 at the other end.

As mentioned before, the disc 56 is fixed between the shaft 26 and the shaft 60. The disc 56 is in contact with the second flat surface portions 42 of the clutch lever support 36 received on the shaft 26. In this state, the projections 68 are received by the square holes 46 of the clutch lever support, while the top portions of the bent clutch levers 66 may be located at the outer side of the disc 56, while the U-shaped grooves 70 receive the shaft 60. (see FIG. 1) In addition, after being assembled to locate the shaft 60 between the pair of U-shaped grooves 70 of the clutch levers 66, a collar 72 is fitted around the shaft 60 with one face of the collar touching the levers 66.

At the portion of the shaft 26 extending through the side plate 2 of the frame, a compression coil spring 74 is provided around the shaft 26 between the side wall 2 and the gear wheel 48.

A lever plate 76 consisting of a piece of plate bent into a U-shape has a central opening 78 which is devised to receive the shaft 60, a pair of tabs or projections 80 provided inside of the plate around the central opening 78 for engagement with the collar 72, and a pair of side panels 82 and 84 arranged perpendicularly to the bottom 86 of the lever plate. The side panel 82 is constituted by a pair of arms 90 and 92 having therein outwardly opened grooves 94 and 96, respectively. The arms 90, 92 are separated from each other by a groove 98 which is formed narrower as it goes towards the ends of the arms. On the other side panel 84, is formed an L-shaped cam 100 bent outwardly from the side panel 84. Cam 100 has an outside edge 100a.

The lever plate 76 as explained above may be assembled to the side plate 2 of the frame in the following manner. The shaft 60 is passed through the central hole 78 provided in the lever plate 76, and the pair of arms 90, 92 on the side panel 82 are passed through a rectangular bore 102 provided in the side plate 2. Then, either or both of the arms 90, 92 are deformed to make the groove 98 broader, by means of a driver or the like, so that the grooves 94, 96 on the arms may be brought into engagement with the inner edges of the rectangular bore 102, whereby the lever plate 76 is fixed firmly to the side plate 2 of the frame.

The bottom portion 86 is extended to form a L-shaped hook 104. A coil spring 106 is provided between the hook 104 and the side plate 2. In the closed state of the clutch, this spring 106 biases the lever plate 76 toward the side plate 2 supported on a fulcrum created at the joint where the pair of arms 90, 92 received by the rectangular bore 102 engages the side plate 2. The biasing force thus provided by the spring 106 is applied to the collar 72 through the pair of projections 80 formed at the inside of the bottom 86 of the lever plate 76, and is also transmitted to the pair of clutch levers 66. Consequently, the disc 56 is pressed onto the clutch lever support 36, by the operation of clutch levers 66 supported on the fulcrum point created at the point where the apex portions 108 of the bent clutch levers 66 engage the disc 56. At the same time, the biasing force exerted by the spring 74 received on the shaft 26 between the side plate 2 and the gear wheel 48 urges the clutch lever support 36 to make a surface contact thereof with the disc 56 against the biasing force of the spring 106, thereby providing a balance of forces in the clutch mechanism.

A worm gear shaft holder 110 consists of a plate bent to form a laterally opened rectangular section including a pair of bent side panels 112, 114 and a main body 116. A round bore 118 is provided in the side panel 112, while an elongated hole 120 extending in the lengthwise direction of the holder is formed in the other side panel 114.

Hanger plates 122 and 124 are attached to the holder, each having a central bore for receiving screws 123. A worm gear shaft 126 carrying a worm gear 128 at a mid portion thereof is also provided. At one end of the worm shaft 126, there is provided a notched groove 130, while, at the other end, there is an annular projection 132 of a diameter larger than that of the bore 118. Between the annular projection and the worm gear 128, there are provided a groove 134 and an annular projection 136 of a diameter smaller than that of the bore 118. A flat gear 138 is provided at one end of the shaft 126 opposite the groove 130.

The worm shaft 126 may be assembled to the worm shaft holder in the following manner.

Figure 3:
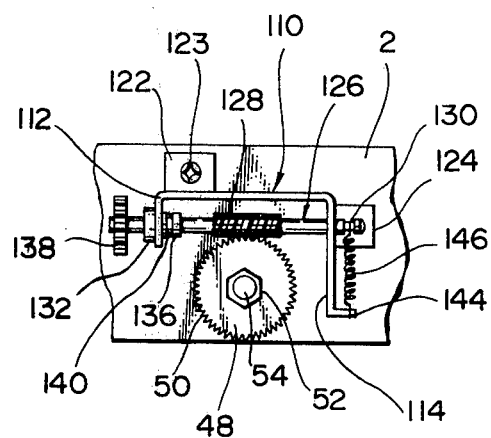
FIG. 3 is a partial side view illustrating the assembly of the worm gear and the gear wheel.

The end of the worm shaft having the groove 130 is arranged to pass through both the bore 118 and the elongated hole 120, so that the bore 118 becomes engaged with the groove 134, and at the same time, the annular projection 136 is also passed through the bore 118. One surface of the annular projection 132 confronting the groove 134 contacts the outer side of the bore 118 of the side panel 112 of the worm shaft holder 110. Between the surface of the groove 134 and the inner surface of the side panel 112, there is provided a leaf spring 140 which is initially loaded to press one surface of the annular projection 132 onto the outer surface of the side plate 112, so that the shaft 126 may be assembled to the worm shaft holder 110 without slack along the lengthwise direction thereof. (See FIG. 3) Furthermore, screws 123 after passing through the pair of hanger plates 122, 124 on the worm shaft holder 110, are screwed into the threaded bores 142 formed in the side plate 2, so that the worm holder 110 and the worm shaft 126 may be firmly secured to the side plate 2. As soon as the assembling operation is completed, the worm gear 128 on the worm shaft 126 is in meshing engagement with the gear 50 on the gear wheel 48, whereby the rotation of the gear wheel 48 is controlled by a manual tuning shaft 149. Referring to FIG. 3, the end of the side panel 114 of the worm shaft holder 110 is bent to form an L-shaped hook 144. A coil spring 146 is provided between the hook and the groove 130 on the worm shaft 110 assembled as heretofore explained. This spring exerts a resilient force to maintain a correct meshing engagement of the worm gear 128 with the gear 50 of gear wheel 48.

A bearing 148 is fixed to the front plate 6 of the frame and rotatably receives a manual tuning shaft 149. A gear 150 provided at one end of the shaft 149 is in meshing engagement with the flat gear 138 provided at the end of the worm shaft 126. The bearing 148 supporting the manual tuning shaft 149 is secured to the front plate 6 to permit the gear 150 to engage the gear 138.

Since it has been described with reference to the prior art why the clutch mechanism is necessary in the operation of a push-button type tuner, no further explanation on the subject will be made herein. Hereinafter, the operation of the mechanism for varying the inductance will be described.

Figure 5:
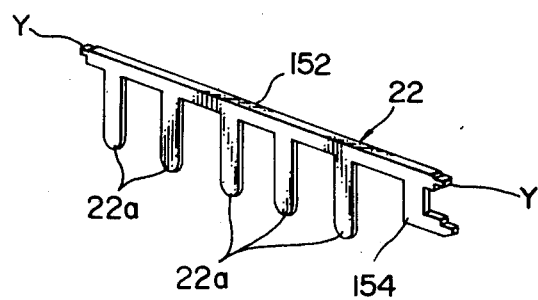
FIG. 5 is a perspective view of the rotary member.

When the push-button 10 is depressed and shifted in the direction of arrow B together with push bar 16, against the coil spring 20, the L-shaped push bar edge 16a contacts one of the teeth 22a of the comb-like rotary member 22 and pushes member 22 rearwardly. Thereby, the member 22 is rotated with the shaft 152 as an axis, as will be seen from FIG. 5. With the rearward rotation of the shaft 152 of member 22, the edge of the L-shaped portion 154 which is integrally formed at one end of the rotary member 22 is simultaneously rotated and is brought into sliding contact with the outside edge 100a of the cam 100 of the lever plate 76. This results in a tilting movement of the lever plate 76 away from the side plate 2. The lever plate 76 is tilted about a fulcrum created at the point where the lever plate 76 engages the side plate 2, i.e. where arms 90, 92 are received by bore 102 in plate 2. Thus, the cam 100 is forced to move away from the side plate 2 of the frame against the force of the coil spring 106, whereby the biasing force of the coil spring 106, working on the collar 72 and the clutch levers 66 is released, and naturally the pressing force of the lever support 36 and the clutch levers 66 onto the disc 56 sandwitched therebetween is dismissed. Consequently, the shaft 26, the disc 56 and the shaft 60 formed as a unit are allowed to rotate upon the rotation of manual tuning shaft 149 at the declutched state, as in the case of the conventional arrangement. In this state, the treadle bar assembly 24, shaft 26, disc 56 and the shaft 60 can be rotated by an external force, because they are disengaged from the clutch lever support 36 which is fitted to the gear wheel 48 which is meshing with the worm gear 128.

As the push button is further advanced, the channeling plate 18 is also advanced to collide with the pair of the parallel rods 32, 34 of the treadle assembly, whereby the rotation angle of the treadle bar assembly 24 is set corresponding to the position of the channeling plate 18 so advanced. The inductance is thus changed by the depression of the push button 10 by reproducing the rotation angle of the treadle bar assembly 24.

Subsequently, as the depressing force of the push button 10 is released, the push button mechanism 9 returns to the initial condition due to the biasing force of the coil spring 20, and the comb-like rotary member 22 and the lever plate 76 are also returned to their respective initial positions. The biasing force of the coil spring 106 acts again on the collar 72 with the result that the clutch lever support 36 and the disc 56 are pressed against each other by means of clutch levers 66, as heretofore explained. Thus, the clutch mechanism is in the clutched or closed state, with the correct position of the core with respect to the coil body being maintained.

The manual tuning operation is performed as follows. The rotation of shaft 149 is transmitted to worm gear shaft 126, through the gears 150, 138, with resultant driving of the gear wheel 48 by the worm gear 128. Since the clutch mechanism is in the closed or clutched state, the rotation of the gear wheel 48 is transmitted to the shaft 60 and the shaft 26, through the clutch lever support 36 and the disc 56 which rotate together. Consequently, the treadle bar assembly 24 connected to the shaft 26 becomes rotatable. Thus the performance of the manual tuning operation, i.e. the manual variation of the inductance may become possible.

The effect of the invention will be described hereinafter. The engagement or disengagement of the clutch mechanism is performed by the coil spring 106, acting on the pair of clutch levers 66 through the collar 72. Thus, the clutching or declutching operation is effectively performed by the utilization of a pair of clutch levers and a clutch lever support. The illustrated embodiment shows the mechanism employing a pair of clutch levers. However, it should be kept in mind that plural pairs of clutch levers are also available for an effective operation.

Figure 4:
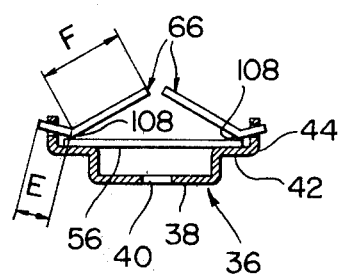
FIG. 4 is a sectional view illustrating the leverage mechanism including the disc, sandwitched between the levers and the lever support.

Referring to FIG. 4, by changing the dimensions E and F of the clutch lever 66 at both sides of the apex 108, the closing force, i.e. the force for maintaining the position of the core, can be considerably strengthened and improved. This feature is devised to attain an effective clutching or declutching operation in the same manner as in the heretofore explained conventional arrangement in which size of the two discs or the biasing force of the spring may be changed to obtain a better operation. However, as compared with the conventional arrangement, the smaller spring of this invention results in a smoother operation of the mechanism, since the mechanism of this invention is so devised as to make effective use of levers coupled with a lever support and a disc in the clutching and declutching operations. Since a sufficient operation of the clutch mechanism is obtained by using a smaller spring, the whole structure of the mechanism can be made considerably more compact.

In addition, since the resilient force of the coil spring 106 acting on the lever plate 76 is transmitted through a pair of projections 80 to the collar 72, the friction between the collar 72 and the lever plate 76 is made considerably smaller, as compared with the case where the collar 72 directly contacts the flat inner surface of the bottom section 86 of the lever plate 76.

The collar 72 may be made of plastics for facilitating the manufacture and reducing the cost of the mechanism. At the same time, the gear wheel 48 may be made of plastics also, thereby providing a more gentle and noiseless engagement with the worm gear 128, as compared with the case where the gear wheel is made of metal.

The frictional resistance between the disc 56 and the clutch lever support 36 or between the clutch levers 66 and the disc 56 may be conveniently increased by forming an uneven rugged surface on either or both sides of the disc 56.

Since the connection between the clutch lever support 36 and the gear wheel 48 is performed by means of press-fitting polygonal bearing 52 on the gear wheel 48 into the corresponding polygonal bore 40 formed in the clutch lever support 36, the connection between the two parts is so firmly insured that a smooth and simultaneous rotation of the two parts may be obtained.

As heretofore explained, this invention provides various advantages and uses over conventional mechanisms.

As many apparently widely different embodiments of this invention may be made without departing from the spirit and scope thereof, it is to be understood that the invention is not limited to the above specific embodiments thereof except as defined in the appended claims.

What is claimed is:

1. In a push-button type tuner of the type including plural push buttons operatively supported in a frame, wherein cores are shiftable with respect to core bodies to achieve a variation in inductance, and wherein the varied position of a core may be maintained, the improvement of a clutch mechanism comprising:

a lever plate having a first end tiltably secured to a side plate of said frame and a second end having a cam edge, said lever plate having an opening therein;

a treadle bar assembly mounted within said frame and having a first shaft extending through said side plate toward said lever plate;

a gear wheel rotatably fitted about said first shaft;

a clutch lever support fixedly connected to said gear wheel to be rotatable about said first shaft;

a manual tuning mechanism including a worm gear shaft having a worm gear meshing with said gear wheel for rotating said gear wheel and thus said clutch lever support;

a second shaft having a first end extending through said opening in said lever plate and a second end secured to said first shaft;

a disc fixedly positioned between said first shaft and said second end of said second shaft;

plural clutch levers having first ends retained in said clutch lever support and second ends embracing said second shaft, said clutch levers having apex portions contacting said disc;

a collar slidably positioned on said second shaft in contact with said second ends of said clutch levers;

spring means, connected between said side plate and said second end of said lever plate, for urging said second end of said lever plate to tilt about said first end thereof toward said side plate and to press against said collar, for thereby pressing said collar against said clutch levers, for thereby pressing said clutch levers against said disc, and for thereby pressing said disc against said clutch lever support, thus providing a clutching operation; and a rotary member pivotally supported in said frame, said rotary member having an L-shaped projection on an end thereof adjacent said cam edge of said second end of said lever plate, such that depression of one of said push buttons pivots said rotary member such that said L-shaped projection pushes against said cam edge and pivots said lever plate away from said side plate against the biasing force of said spring means, thus providing a declutching operation.

2. The improvement claimed in claim 1, further comprising a coil spring arranged on said first shaft between said side plate and said gear wheel.

3. The improvement claimed in claim 1, further comprising projections on said lever plate at positions adjacent said opening, said projections making contact with said collar under the influence of said spring means.

4. The improvement claimed in claim 1, wherein at least one of the opposite surfaces of said disc is roughened.

5. The improvement claimed in claim 1, wherein said lever plate has a substantially U-shaped configuration formed by a bottom section having said opening therein and first and second side sections, said first side section having at the free end thereof a pair of arms with a slot therebetween, each said arm having therein an outwardly facing groove, said cam edge being at the free end of said second side section.

6. The improvement claimed in claim 1, further comprising a worm gear shaft holder supported on said side plate and having a side panel with a bore therethrough, a first groove in a first end of said worm gear shaft, a first annular projection on a second end of said worm gear shaft, said first annular projection having a diameter larger than that of said bore, a second annular projection on said worm gear shaft at a position spaced from said first annular projection, said second annular projection having a diameter smaller than that of said bore, and a second groove in said worm gear shaft at a position between said first and second annular projections.

* * * * *